United States Patent [19]

Hosoi et al.

[11] Patent Number: 4,694,171

[45] Date of Patent: Sep. 15, 1987

[54] ELECTRON MICROSCOPE IMAGE FOCUSING USING INSTANTANEOUS EMISSION OF STIMULABLE PHOSPHOR SHEET

[75] Inventors: Yuichi Hosoi; Nobufumi Mori; Kenji Takahashi; Junji Miyahara, all of Kanagawa, Japan

[73] Assignee: Fuji Photo Film Co., Ltd., Japan

[21] Appl. No.: 801,819

[22] Filed: Nov. 26, 1985

[30] Foreign Application Priority Data

Nov. 29, 1984 [JP] Japan .................... 59-252638

[51] Int. Cl.$^4$ ................... H01J 37/21; H01J 37/22
[52] U.S. Cl. ................... 250/311; 250/327.2; 250/397
[58] Field of Search ............ 250/327.2, 337, 484.1, 250/397, 311, 310

[56] References Cited

U.S. PATENT DOCUMENTS

| | | | |
|---|---|---|---|
| 3,529,154 | 9/1970 | Bouwmeester | 250/311 |
| 3,859,527 | 1/1975 | Luckey | 250/327.2 |
| 4,099,055 | 7/1978 | Todokoro | 250/311 |
| 4,236,078 | 11/1980 | Kotera et al. | 250/363 R |
| 4,239,968 | 12/1980 | Kotera | 250/327.2 |
| 4,258,264 | 3/1981 | Kotera et al. | 250/484.1 |
| 4,276,473 | 6/1981 | Kato et al. | 250/327.2 |
| 4,284,889 | 8/1981 | Kato et al. | 250/354.1 |
| 4,315,318 | 2/1982 | Kato et al. | 364/515 |
| 4,336,154 | 6/1982 | Nishimura et al. | 252/301.4 H |
| 4,346,295 | 8/1982 | Tanaka et al. | 250/327.2 |
| 4,387,428 | 6/1983 | Ishida et al. | 364/414 |
| 4,394,581 | 7/1983 | Takahashi et al. | 250/484.1 |
| 4,400,619 | 8/1983 | Kotera et al. | 250/327.2 |
| 4,505,989 | 3/1985 | Umemoto et al. | 428/691 |
| 4,527,061 | 7/1985 | Horikawa et al. | 250/327.2 |
| 4,539,138 | 9/1985 | Miyahara et al. | 252/301.4 H |
| 4,631,407 | 12/1986 | Kawajiri et al. | 250/327.2 |
| 4,651,220 | 3/1987 | Hosoi et al. | 358/256 |

FOREIGN PATENT DOCUMENTS

| | | |
|---|---|---|
| 55-47719 | 4/1980 | Japan . |
| 55-47720 | 4/1980 | Japan . |
| 56-11395 | 2/1981 | Japan . |
| 56-116777 | 9/1981 | Japan . |
| 57-23675 | 2/1982 | Japan . |
| 58-121874 | 7/1983 | Japan . |
| 59-56479 | 3/1984 | Japan . |
| 61-93538 | 5/1986 | Japan . |

*Primary Examiner*—Janice A. Howell
*Assistant Examiner*—Constantine Hannaher
*Attorney, Agent, or Firm*—Gerald J. Ferguson, Jr.; Michael P. Hoffman; Ronni S. Malamud

[57] ABSTRACT

A two-dimensional image sensor is exposed under vacuum to an electron beam having passed through a specimen, and instantaneous light emitted from the image sensor upon exposure to the electron beam is detected with an image intensifier to reproduce an image observed to attain a desired focused condition and/or a desired field. After the image has been focused by the operator while observing the image, the image sensor is exposed under vacuum to an electron beam having been transmitted through the specimen to store the energy of the electron beam representative of the image of the specimen on the image sensor. Then, stimulating energy is applied to the image sensor for discharging light therefrom which represents the stored energy of the electron beam. The light discharged from the image sensor is photoelectrically detected to reproduce the transmitted electron-beam image of the specimen as a final output image thereof under the desired focused condition and/or with said desired field.

6 Claims, 4 Drawing Figures

ELECTRON MICROSCOPE IMAGE FOCUSING USING INSTANTANEOUS EMISSION OF STIMULABLE PHOSPHOR SHEET

BACKGROUND OF THE INVENTION

1. Field of the Invention

The present invention relates to a method of recording and reproducing images produced by an electron microscope, and more particularly to a method of recording electron microscope images with high sensitivity and of reproducing the recorded electron microscope images in the form of electric signals in order to allow the images to be processed in various ways.

2. Description of the Prior Art

There are known electron microscopes for obtaining a magnified image of a specimen by deflecting a beam of electrons transmitted through the specimen with an electric or magnetic field. As is well known, the electron beam having passed through the specimen forms a diffraction pattern on the rear focal plane of the objective lens, and the diffracted beams interfere with each other again to produce the magnified image of the specimen. The magnified specimen image can be observed as a scattered-light image by projecting the image onto a screen with a projector lens. Alternatively, the rear focal plane of the objective lens may be projected for enabling the user to observe the magnified diffraction pattern of the image. Where an intermediate lens is positioned between the objective lens and the projector lens, the magnified scattered-light image or the diffraction pattern may be produced selectively as desired by adjusting the focal length of the intermediate lens.

For observing the magnified image or the diffraction pattern (hereinafter referred to collectively as a "transmitted electron-beam image"), it has been the general practice to place a photographic film on the image formation plane for exposure to the transmitted electronbeam image. However, the use of photographic films is disadvantageous in that their sensitivity to electron beams is low and the process of developing the films is complex.

Transmitted electron-beam images are often processed to make them easier to see. Specifically, the transmitted electron-beam images are subject to various signal processing modes such as tone processing, frequency emphasis, density processing, subtractive processing, and additive processing. The images are also processed to reconstruct three-dimensional images by Fourier analysis, digitize the images, and measure particle diameters. The diffraction patterns are also processed to analyze crystal information and find lattice constants, dislocations, and lattice defects. For such image and diffraction pattern processing, it has been customary to convert the electron microscope image on a developed photographic film into an electric signal with a microphotometer, convert the electric signal into a digital signal, and then process the digital signal with a computer. This process has proven unsatisfactory since it is quite complex.

SUMMARY OF THE INVENTION

In view of the aforesaid problems of the prior electron microscope image recording devices, it is an object of the present invention to provide a method of recording and reproducing electron microscope images with high sensitivity and quality and of recording electron microscope images in such a manner that electric signals representing the images can directly be produced so as to be processed easily in various ways.

According to the present invention, there is provided a method of recording and reproducing an image produced by an electron microscope, comprising the steps of exposing a two-dimensional image sensor under vacuum to an electron beam having passed through a specimen, detecting instantaneous light emitted from the image sensor upon exposure to the electron beam with an image intensifier to reproduce an image which can be observed to attain a desired focused condition and/or a desired field, thereafter exposing the image sensor under vacuum to an electron beam having been transmitted through the specimen to store the energy of the electron beam representative of the image of the specimen on the image sensor, applying stimulating energy to the image sensor for discharging light therefrom which represents the stored energy of the electron beam, and photoelectrically detecting the light discharged from the image sensor to reproduce the transmitted electron-beam image of the specimen as a final output image thereof under the desired focused condition and/or with said desired field.

The two-dimensional image sensor comprises a stimulable phosphor sheet as disclosed in Japanese Unexamined Patent Publication No. 56(1981)-11395 and U.S. Pat. Nos. 4,258,264, 4,276,473, 4,315,318 and 4,387,428, for example. Certain phosphors, when exposed to a radiation such as an electron ray, store a part of the energy of the radiation. When the phosphor exposed to the radiation is exposed to stimulating rays such as visible light, the phosphor emits light (stimulated emission) in proportion to the stored energy of the radiation. Such a phosphor is called a stimulable phosphor, and the stimulable phosphor sheet is generally composed of a support and a stimulable phosphor layer disposed on the support. The stimulable phosphor layer may be formed by dispersing the stimulable phosphor in a suitable binder. However, the stimulable phosphor layer may itself be a stimulable phosphor sheet if it is self-supporting.

The two-dimensional sensor may also be in the form of a thermoluminescent phosphor sheet as disclosed in Japanese Patent Publication Nos. 55(1980)-47719 and 55(1980)-47720, for example. The thermoluminescent phosphor sheet emits stored radiation energy as thermoluminescence when heat is applied to the sheet. The thermoluminescent phosphor sheet may be constructed in the same manner as the stimulable phosphor sheet.

The two-dimensional sensor is placed on the image formation plane of the electron microscope, and the electron microscope image is recorded on the two-dimensional sensor by the electron beam transmitted through the specimen. Then, the two-dimensional sensor on which the electron microscope image is stored is scanned by stimulating rays such as visible light or heat to enable the image sensor to emit the stored electron beam energy as light. The emitted light is then photoelectrically read to produce an electric signal indicative of the transmitted electron-beam image. The electric image signal thus generated may be employed to display the electron microscope image on a display unit such as a CRT, or to record the electron microscope image permanently as a hard copy, or to store the electron microscope image temporarily on a recording medium such as a magnetic tape, a magnetic disk, or the like.

The electron microscope images can be recorded with high sensitivity by the two-dimensional sensor of the type described above. Damage to the specimen can be reduced since the amount of exposure of the specimen to the electron beam can be reduced. The electric image signals produced from the two-dimensional sensor can be processed in various modes, such as tone processing and frequency emphasis, for example. The processing of diffraction patterns, and image analyses such as the reconstruction of three-dimensional images and image digitization can simply and quickly be performed by applying the electric signal to a computer.

As disclosed in U.S. Pat. No. 4,284,889, the two-dimensional image sensor, when exposed to a radiation (which is an electron beam in the present invention), stores a part of the absorbed radiation energy and at the same time discharges the remainder of the absorbed radiation energy as non-storable light (hereinafter referred to as "instantaneous light"). The instantaneous light is proportional to the stored radiation energy.

According to the method of the present invention, the focus-checking image is produced by detecting the instantaneous light with the image intensifier, amplifying the detected light, and then outputting the same with high sensitivity. Therefore, for reproducing the focus-checking image it is not necessary to cause the image sensor to produce stimulated light emission or thermoluminescence and read it photoelectrically, and the amount of the electron beam or heat to be radiated on the specimen for focus-checking purposes can be reduced.

The stimulable phosphor employed in the stimulable phosphor sheet according to the present invention may comprise phosphors expressed by the composition formulas: SrS:Ce, Sm; SrS:Eu, Sm; ThO$_2$:Er; and La$_2$O$_2$S:Eu, Sm, as disclosed in U.S. Pat. No. 3,859,527.

The stimulable phosphor may also comprise phosphors expressed by the composition formulas: ZnS:Cu,Pb; BaO.xAl$_2$O$_3$:Eu [where $0.8 \leq X \leq 10$]; and $M^{II}$O.xSiO$_2$:A [where $M^{II}$ is Mg, Ca, Sr, Zn, Cd, or Ba; A is Ce, Tb, Eu, Tm, Pb, Tl, Bi, or Mn; and $0.5 \leq X \leq 2.5$], as disclosed in U.S. Pat. No. 4,236,078.

The stimulable phosphor may also comprise phosphors expressed by the composition formula: (Ba$_{1-x-y}$, Mg$_x$, Ca$_y$)FX:aEu$^{2+}$ [where X is at least one of Cl and Br; $O < x + y \leq 0.6$, $xy \neq 0$, and $10^{-6} \leq a \leq 5 \times 10^{-2}$], as disclosed in Japanese Unexamined Patent Publication No. 55(1980)-12143.

The stimulable phosphor may also comprise phosphors expressed by the composition formula: LnOX:xA [where Ln is at least one of La, Y, Gd, and Lu; X is at least one of Cl and Br; A is at least one of Ce and Tb; and $O < x < 0.1$], as disclosed in U.S. Pat. No. 4,236,078.

The stimulable phosphor may also comprise phosphors expressed by the composition formula: (Ba$_{1-x}$, $M^{II}_x$)FX:yA [where $M^{II}$ is at least one of Mg, Ca, Sr, Zn, and Cd, X is at least one of Cl, Br, and I; A is at least one of Eu, Tb, Ce, Tm, Dy, Pr, Ho, Nd, Yb, and Er; $O \leq x \leq 0.6$, and $O \leq y \leq 0.2$], as disclosed in U. S. Pat. No. 4,239,968.

The stimulable phosphor may also comprise phosphors expressed by the composition formula: $M^{II}$FX.xA:yLn [where $M^{II}$ is at least one of Ba, Ca, Sr, Mg, Zn, and Cd; A is at least one of BeO, MgO, CaO, SrO, BaO, ZnO, Al$_2$O$_3$, Y$_2$O$_3$, La$_2$O$_3$, In$_2$O$_3$, SiO$_2$, TlO$_2$, ZrO$_2$, GeO$_2$, SnO$_2$, Nb$_2$O$_5$, Ta$_2$O$_5$, and ThO$_2$; Ln is at least one of Eu, Tb, Ce, Tm, Dy, Pr, Ho, Nd, Yb, Er, Sm, and Gd; X is at least one of Cl, Br, and I; $5 \times 10^{-5} < x < 0.5$, and $O < y < 0.2$], as disclosed in Japanese Unexamined Patent Publication No. 55(1980)-160078 (U.S. patent application No. 591,224 now U.S. Pat. No. 4,539,138).

The stimulable phosphor may also comprise phosphors expressed by the composition formula: (Ba$_{1-x}$, $M^{II}_x$)F$_2$.aBaX$_2$:yEu$^{2+}$, zA [where $M^{II}$ is at least one of beryllium, magnesium, calcium, strontium, zinc, and cadmium; X is at least one of chlorine, bromine, and iodine; A is at least one of zirconium and scandium; $0.5 \leq a \leq 1.25$, $O \leq x \leq 1$, $10^{-6} \leq y \leq 2 \times 10^{-1}$, and $0 < z \leq 10^{-2}$], as disclosed in Japanese Unexamined Patent Publication No. 56(1981)-116777.

The stimulable phosphor may also comprise phosphors expressed by the composition formula: (Ba$_{1-x}$, $M^{II}_x$)F$_2$.aBaX$_2$:yEu$_{2+}$, zB [where $M^{II}$ is at least one of beryllium, magnesium, calcium, strontium, zinc, and cadmium; X is at least one of chlorine, bromine and iodine; $0.5 \leq a \leq 1.25$, $0 \leq x \leq 1$, $10^{-6} \leq y \leq 2 \times 10^{-1}$, and $O < z \leq 10^{-1}$], as disclosed in U.S. Pat. No. 4,336,154.

The stimulable phosphor may also comprise phosphors expressed by the composition formula: (Ba$_{1-x}$, $M^{II}_x$)F$_2$.aBaX$_2$:yEu$^{2+}$, zA [where $M^{II}$ is at least one of beryllium, magnesium, calcium, strontium, zinc, and cadmium; X is at least one of chlorine, bromine, and iodine; A is at least one of arsenic and silicon; $0.5 \leq a \leq 1.25$, $0 \leq x \leq 1$, $10^{-6} \leq y \leq 2 \times 10^{-1}$, and $0 < z \leq 5 \times 10^{-1}$], as disclosed in Japanese Unexamined Patent Publication No. 57(1982)-23675.

The stimulable phosphor may also comprise phosphors expressed by the composition formula: (Ba$_{1-x}$M$_{x/2}$ L$_{x/2}$ FX:yEu$^{2+}$ [where M is at least one alkaline metal selected from the group consisting of Li, Na, K, Rb, and Cs; L is at least one trihydric metal selected from the group consisting of Sc, Y, La, Ce, Pr, Nd, Pm, Sm, Gd, Tb, Dy, Ho, Er, Tm, Yb, Lu, Al, Ga, In, and Tl; X is at least one halogen selected from the group consisting of Cl, Br, and I; $10^{-2} \leq x \leq 0.5$, and $0 < y \leq 0.1$], as disclosed in Japanese Unexamined Patent Publication No. 58(1983)-206678 (U.S. patent application No. 741,020 now continued as U.S. application No. 841,044). The stimulable phosphor may also comprise phosphors expressed by the composition formula: BaFX. xA:yEu$^{2+}$ [where X is at least one halogen selected from the group consisting of Cl, Br, and I; A is a calcined tetrafluoroboric compound; $10^{-6} \leq x \leq 0.1$, and $0 < y \leq 0.1$], as disclosed in Japanese Unexamined Patent Publication No. 59(1984)-27980.

The stimulable phosphor may also comprise phosphors expressed by the composition formula: BaFX. xA:yEu$^{2+}$ [where X is at least one halogen selected from the group consisting of Cl, Br, and I; A is at least one calcined compound selected from the group consisting of the salts of monohydric or dihydric metals of hexafluorosilicic acid, hexafluorotitanic acid, and hexafluorozirconic acid; $10^{-6} \leq x \leq 0.1$, and $0 < y \leq 0.1$], as disclosed in Japanese Unexamined Patent Publication No. 59(1984)-47289.

The stimulable phosphor may also comprise phosphors expressed by the composition formula: BaFX.x NaX': aEu$^{2+}$ [where each of X and X' is at least one of Cl, Br, and I; $0 < x \leq 2$, and $0 < a \leq 0.2$], as disclosed in Japanese Unexamined Patent Publication No. 59(1984)-56479.

The stimulable phosphor may also comprise phosphors expressed by the composition formula: $M^{II}$FX .

xNaX': yEu$^{2+}$ [where M$^{II}$ is at least one alkaline earth metal selected from the group consisting of Ba, Sr, and Ca; each of X and X' is at least one halogen selected from the group consisting of Cl, Br, and I; A is at least one transition metal selected from the group consisting of V, Cr, Mn, Fe, Co, and Ni; $0 < x \leq 2$, $0 < y \leq 0.2$, and $0 < z \leq 10^{-2}$], as disclosed in U.S. Pat. No. 4,505,989.

The stimulable phosphor may also comprise phosphors expressed by the composition formula: M$^{II}$FX·aM$^{I}$X'·bM'$^{IIX''}_{2}$·cM$^{III}$X'''$_3$·XA:YEu$^{2+}$ [where M$^{II}$ is at least one alkaline earth metal selected from the group consisting of Ba, Sr, and Ca; M$^{I}$ is at least one alkaline metal selected from the group consisting of Li, Na, K, Rb, and Cs; M'$^{II}$ is at least one dihydric metal selected from the group consisting of Be and Mg; M$^{III}$ is at least one trihydric metal selected from the group consisting of Al, Ga, In, and Tl; A is a metal oxide; X is at least one halogen selected from the group consisting of Cl, Br, and I; X', X", and X''' are at least one halogen selected from the group consisting of F, Cl, Br, and I; $0 \leq a \leq 2$, $0 \leq b \leq 10^{-2}$, $0 \leq c \leq 10^{-2}$, and $a+b+c \leq 10^{-6}$; $0 < x \leq 0.5$ and $0 < y \leq 0.2$], as disclosed in Japanese Unexamined Patent Publication No. 59(1984)-75200 filed by the present applicant.

The stimulable phosphor may also comprise phosphors expressed by the composition formula: M$^{II}$X$_2$·aM$^{II}$X'$_2$:xEu$^{2+}$ [where M$^{II}$ is at least one alkaline earth metal selected from the group consisting of Ba, Sr, and Ca; X and X' are at least one halogen selected from the group consisting of Cl, Br, and I with $X \neq X'$; $0.1 \leq a \leq 10.0$ and $0 < x \leq 0.1$], as disclosed in Japanese Patent Application No. 58(1983)-193161 (U.S. patent application No. 834,886).

The stimulable phosphor which can be employed in the present invention is however not limited to the aforesaid phosphors, but may be any phosphor capable of stimulated emission upon exposure to stimulating light after it has been irradiated with a radiation such as an electron beam.

Preferred thermoluminescent phosphors that can be used in the present invention include compounds produced by adding a small amount of at least one of Mn, Dy, and Tm to sulphuric compounds such as Na$_2$SO$_4$, CaSO$_4$, SrSO$_4$, and BaSO$_4$.

The phosphor sheet may additionally have a protective layer and a light-reflecting or light-absorbing undercoated layer. The phosphor layer of the phosphor sheet may be colored with a pigment or a dye as disclosed in U.S. Pat. No. 4,394,581. The phosphor sheet may be in any desired shape such as a roll, an endless belt, a drum, or a plate.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
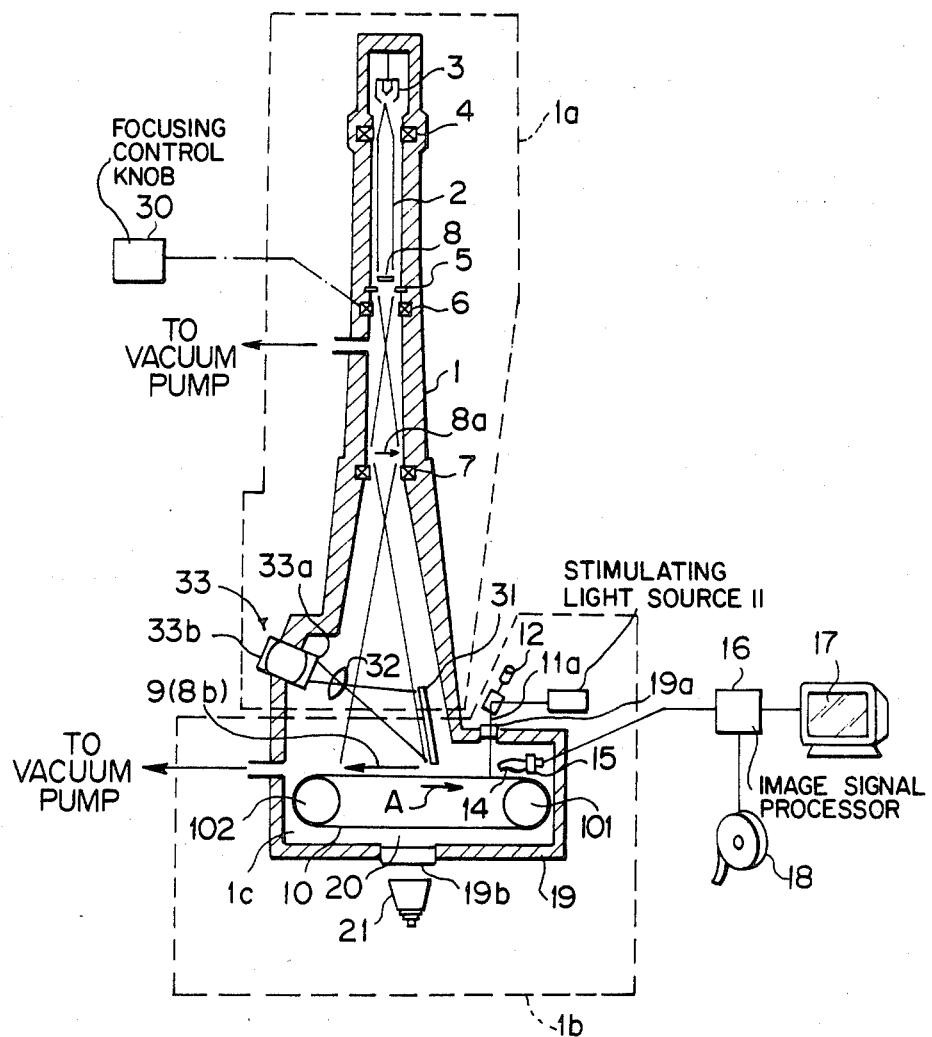
FIG. 1 is a vertical cross-sectional view of a device for carrying out a method of recording and reproducing images produced by an electron microscope according to a first embodiment of the present invention.

Like or corresponding parts are denoted by like or corresponding reference characters throughout several views.

FIG. 1 shows a device for recording and reproducing electron microscope images, the device being employed to perform a method according to a first embodiment of the present invention. The device includes an electron microscope 1a having a tubular lens barrel 1 and a recorder/reader assembly 1b composed of a stimulable phosphor sheet 10 serving as a two-dimensional image sensor, a stimulating means for scanning the stimulable phosphor sheet 10 with stimulating light while the stimulable phosphor sheet 10 is placed under vacuum, and a detector means for photoelectrically detecting light emitted by the stimulable phosphor sheet 10. The stimulable phosphor sheet 10 and the image-formation plane 9 of the electron microscope 1a are positioned in one vacuum chamber 1c of the recorder/reader assembly 1b at least when the stimulable phosphor sheet 10 is exposed to an electron beam for recording an image thereon. The interior of the lens barrel 1 and the interior of the vacuum chamber 1c are kept under vacuum by any known means such as a vacuum pump while the electron microscope 1a is in operation.

The lens barrel 1 houses an electron gun 3 for emitting an electron beam 2 at a uniform speed, at least one convergent lens 4 comprising a magnetic lens or an electrostatic lens for converging the electron beam 2 toward a specimen 8, a specimen support 5, an objective lens 6 identical to the convergent lens 4, and a projector lens 7. The electron beam 2 having passed through the specimen 8 placed on the specimen support 5 is deflected by the objective lens 6 to form a magnified scattered-light image 8a of the specimen 8. The magnified scattered-light image 8a is focused by the projector lens 7 as an image 8b on the image-formation plane 9.

The stimulable phosphor sheet 10 in the recorder/reader 1b is in the form of an endless belt trained around a cylindrical driver roller 101 and a cylindrical driven roller 102 spaced horizontally from each other in the vacuum chamber 1c. The stimulating means has a stimulating light source 11 comprising an He - Ne laser or a semiconductor laser for emitting a stimulating light beam 11a and a light deflector 12 such as a galvanometer mirror for deflecting the stimulating light beam 11a transversely across the sheet 10 to scan the same. The vacuum chamber 1c is defined by a casing 19 communicating with the lens barrel 1 and having a light-transmissive wall member 19a made as of lead glass and through which the stimulating light beam 11a is transmitted from the light deflector 12 toward the sheet 10. The detector means includes a light guide 14 for guiding light emitted from the sheet 10, and a photoelectric transducer 15 such as a photomultiplier coupled to the exit end of the light guide 14 for detecting the emitted light through a filter which removes the stimulating light to produce a corresponding electric signal. The stimulable phosphor sheet 10 is composed of a flexible endless-belt support and a stimulable phosphor layer deposited on the outer surface of the endless-belt support. The endless-belt stimulable phosphor sheet 10 is driven to run in the direction of the arrow A when the driver roller 101 is rotated by a drive unit such as a motor.

The endless-belt stimulable phosphor sheet 10, the driver roller 101, the driven roller 102, the lightguide 14, and the photoelectric transducer 15 are disposed in the vacuum chamber 1c. However, the exit end of the light guide 14 may project out of the casing 19 so that the photoelectric transducer 15 may be disposed outside of the vacuum chamber 1c.

In operation, a shutter (not shown) positioned between the electron microscope 1a and the recorder/reader assembly 1b is opened to expose the portion of the stimulable phosphor sheet 10 located in the image-formation plane 9 to an electron beam which bears the scattered-light image 8b of the specimen 8 for thereby storing the electron beam energy on the sheet 10. Then, the driver roller 101 is rotated to move the exposed portion of the sheet 10 toward a read-out section. The exposed portion of the sheet 10 is scanned transversely (primary scanning) by the stimulating light beam 11a deflected by the light deflector 12 and transmitted through the light-transmissive wall member 19a, while at the same time the sheet 10 is continuously moved in the direction of the arrow A so that the sheet 10 is scanned longitudinally (secondary scanning). Therefore, the stimulable phosphor sheet 10 is two-dimensionally scanned by the stimulating light beam 11a. Light which is emitted from the sheet 10 upon exposure to the stimulating light beam 11a enters the light guide 14 through its incident end facing the sheet 10 and travels therethrough while being subject to total reflection therein. The light is then detected by the photoelectric transducer 15 which photoelectrically converts the amount of detected light into an electric signal.

The electric signal generated by the photoelectric transducer 15 is processed by an image signal processor 16, and the processed signal is fed to an image reproducer such a CRT display 17 or a recorder (not shown) in which the signal is recorded on a photosensitive film. The signal may also be temporarily stored on a recording medium 18 such as a magnetic tape or a magnetic disc for image reproduction at a later time. Therefore, the magnified scattered-light image 8b borne by the light emitted from the sheet 10 can be reproduced by the electric signal commensurate with the amount of light emitted from the sheet 10.

Figure 4:
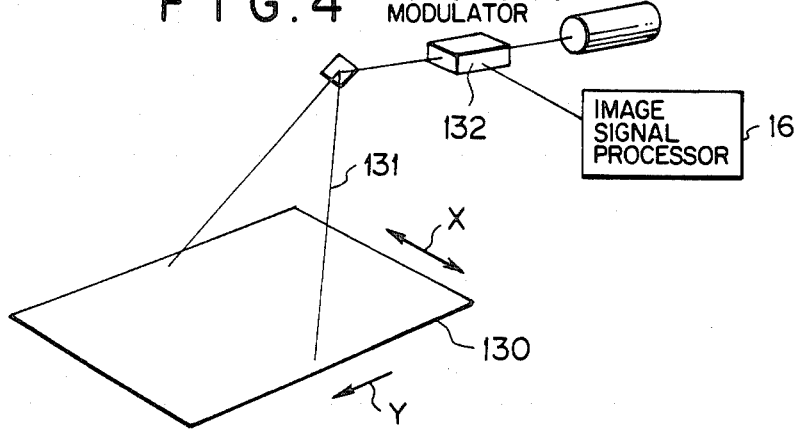
FIG. 4 is a perspective view of an image reproducer for reproducing an electron microscope image according to the method of the present invention.

FIG. 4 shows an image scanning recorder which can be used as the image reproducer. A photosensitive film 130 is scanned transversely in the direction of the arrow X (primary scanning) by a laser beam 131 while at the same time the photosensitive film 130 is moved in the direction of the arrow Y (secondary scanning). At this time, a laser beam 131 is modulated by an acoustooptic modulator 132 based on the image signal supplied from the image processor 16 for thereby forming a visible image on the photosensitive film 130.

The size of the visible image reproduced on the photosensitive film 130 is selected to be larger than the size of the image-formation plane 9 (i.e., the area in which the radiation image energy is recorded on the sheet 10). Therefore, the magnified scattered-light image 8b is reproduced on the photosensitive film 130 at a scale greater than that on the image-formation plate 9. The image reproduced at the enlarged scale on the photosensitive film 130 is of sufficiently good quality since the magnified scattered-light image 8b can be defined with high sharpness by using the stimulable phosphor sheet 10. As a consequence, the stimulable phosphor sheet 10 may be of a relatively small size, and the photoelectric transducer 15 may also be small in size, with the result that the overall device may be small in size.

For producing a magnified image from the image scanning recorder shown in FIG. 4, the density of scanning lines employed in the image scanning recorder should be coarser than the density of scanning lines used in reading image information from the stimulable phosphor sheet 10. More specifically, it is preferable to set the scanning line density to 10 pixels/mm or more, particularly to between 15 pixels/mm and 100 pixels/mm for reading sufficiently image information from the stimulable phosphor sheet 10 of a relatively small size. For reproducing a magnified image without degrading its quality, the scanning line density for recording the image is selected to be coarser than the above scanning line density and preferably in the range from 5 pixels/mm to 20 pixels/mm.

The magnified scattered-light image 8b (final output image) reproduced on the image reproducer for observing the specimen 8 should be focused accurately. A focusing process to be effected before the final ouput image is reproduced will be described hereinbelow. As described above, when the shutter between the electron microscope 1a and the recorder/reader assembly 1b is opened to expose the stimulable phosphor sheet 10 to the electron beam 2 transmitted through the specimen 8, the stimulable phosphor sheet 10 emits instantaneous light having an intensity commensurate with the energy of the electron beam 2 which impinges upon the sheet 10, the instantaneous light being indicative of the magnified scattered-light image 8b. The instantaneous light is reflected by a mirror 31 and focused by a focusing lens 32 on the input surface (light-sensitive surface) 33a of an image intensifier 33. The image intensifier 33 then multiplies photoelectrons produced by the input surface 33a and displays an optical image on the output surface (phosphor surface) 33b thereof based on the multiplied photoelectrons. The optical image displayed on the output surface 33b represents the magnified scattered-light image 8b as intensified and is used as a focus-checking image. The electron microscope operator then observes the focus-checking image on the output surface 33b, and controls a focusing control knob 30, according to how the focus-checking image is focused, for varying the electric or magnetic field of the objective lens 6 to change its focal length thereby to adjust the focused condition of the magnified scattered-light image 8b.

After the image 8b has been focused sharply, the shutter is closed, and the stimulable phosphor sheet 10 is fed along until a new portion or area thereof reaches the image-formation plane 9. Then, the stimulable phosphor sheet 10 is stopped, and the magnified scattered-light image 8b is recorded on the new portion of the sheet 10. The magnified scattered-light image 8b newly recorded on the sheet 10 is sharply focused because of the aforesaid focusing process. In the illustrated embodiment, the focus-checking image displayedon the output surface 33b of the image intensifier 33 is directly observed by the operator for focusing the image 8b. However, the focus-checking image on the output surface 33b may be picked up by a television camera and displayed on a CRT, for example, so that the operator can focus the image 8b while observing the displayed focus-checking image. Where the final output image is displayed on the CRT display 17, the CRT display 17 can also be used to display the focus-checking image.

The portion of the sheet 10 which was exposed to the electron beam 2 for focusing purpose stores the magnified scattered-light image 8b. Since this magnified scattered-light image 8b is not to be employed for reproducing the final output image, that sheet portion will not be exposed to the stimulating light beam 11a. The focus-checking image may also be used for determining a desired field of view and a desired magnification of the image. In order to determine a desired field of the final image, the specimen 8 is moved or the position of the scanning area of the electron beam 2 is changed little by little to search the desired field. A shutter may be disposed between the specimen 8 and the electron gun 3 for cutting off the electron beam 2 when the sheet 10 is not exposed to the electron beam 2, so that the specimen 8 will be less subject to damage due to bombardment by the electron beam 2.

After the image has been read from the sheet 10, the image-recording portion thereof (including the portion exposed to the electron beam 2 for focusing purpose) is fed to an erasing zone 20 where erasing light emitted from an erasing light source 21 such as a fluorescent lamp disposed outside of the casing 19 is radiated onto the sheet 10 through a light-transmissive wall member 19b supported on the casing 19. The erasing light is in the same wavelength region as that of the stimulating light for the stimulable phosphor sheet 10. Therefore, upon exposure to the erasing light from the erasing light source 21, any remanent image stored in the phosphor layer of the sheet 10 and noise arising from a radioactive element such as $^{226}Ra$ contained as impurities in the phosphor layer can be discharged from the sheet 10. The erasing light source 21 may comprise a tungsten lamp, a halogen lamp, an infrared lamp, a xenon flash lamp, or a laser source, as disclosed in U.S. Pat. No. 4,400,619.

Figure 2:
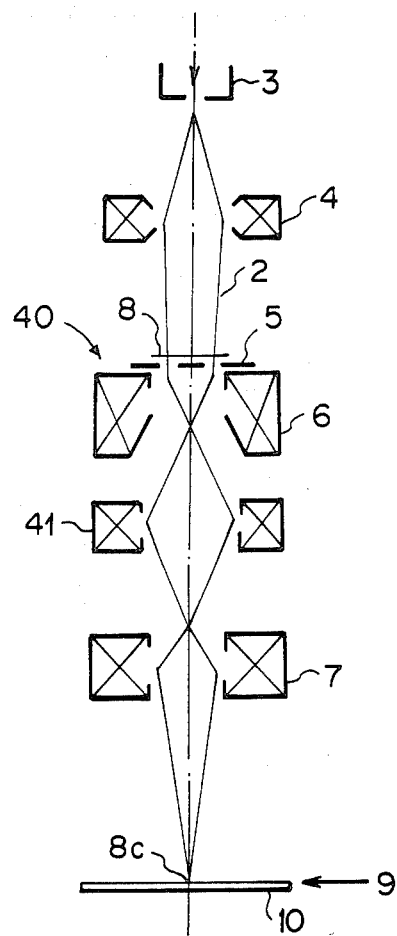
FIG. 2 is a schematic view of an electron microscope which can be employed to effect a method according to a second embodiment of the present invention.

The principles of the present invention can be employed for recording and reproducing the diffraction pattern of a specimen. FIG. 2 is explanatory of a method according to a second embodiment for recording and reproducing such a diffraction pattern 8c of the specimen 8. The electron microscope, generally denoted at 40, has an intermediate lens 41 disposed between the objective lens 6 and the projector lens 7. The diffraction pattern 8c of the specimen 8, which is formed on the rear focal plane of the objective lens 7, is magnified by the intermediate lens 41 and the projector lens 7 with their focal points on the rear focal plane of the objective lens 7 and is projected onto the image-formation plane 9. By placing the stimulable phosphor sheet 10 in the image-formation plane 9, the magnified image of the diffraction pattern 8c can be recorded by the electron beam 2 on the stimulable phosphor sheet 10. The recorded diffraction pattern 8c can be read in the same manner as described with reference to FIG. 1, and the read image can be displayed on the CRT or printed as a hard copy.

Rather than the endless-belt stimulable phosphor sheet 10, a single stimulable phosphor sheet may be employed which is reciprocally moved between the recording and reading zones in the recorder/reader assembly for alternately recording and reading images. One or more such stimulable phosphor sheets may be fixed to a feed means such as an endless belt which is driven to use the stimulable phosphor sheet or sheets in repetitive cycles. With the above alternatives, an image should be recorded on each stimulable phosphor sheet after the portion thereof exposed to the electron beam 2 for focusing purpose has been exposed to the erasing light to erase any remaining image.

Figure 3:
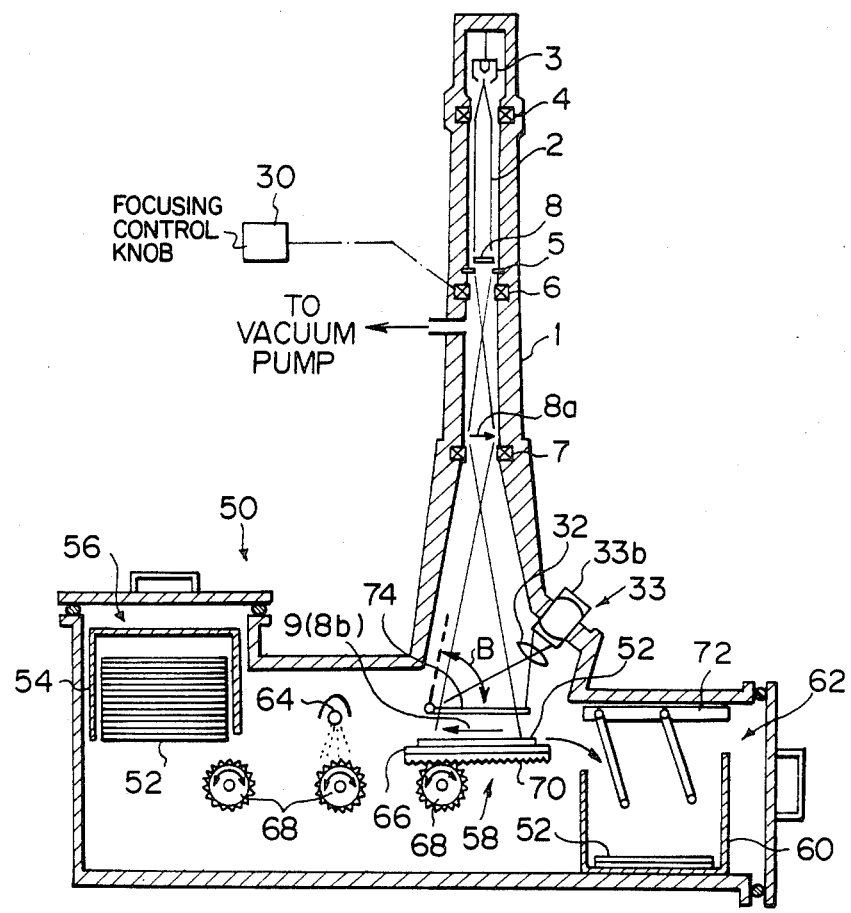
FIG. 3 is a vertical cross-sectional view of a device for carrying out a method of recording and reproducing images produced by an electron microscope according to a third embodiment of the present invention.

FIG. 3 shows a method according to a third embodiment of the present invention in which different stimulable phosphor sheets or two-dimensional image sensors are used respectively for recording a final output image and for focusing an image. The electron microscope employed for carrying out the method is of the same construction as that of the electron microscope 1a shown in FIG. 1. An image recording device 50 is disposed below the tubular lens barrel 1. The image recording device 50 comprises a sensor supply unit 56 for storing a magazine 54 containing a number of stimulable phosphor sheets 52 serving as two-dimensional sensors, a recorder 58 including the image-formation plane 9, and a sensor receiving unit 62 for storing a magazine 60 identical to the magazine 54 in the sensor supply unit 56. An erasing light source 64 is disposed between the sensor supply unit 56 and the recorder 58. A sheet supply table 66 is positioned for horizontal movement between the sensor supply unit 56 and the recorder 58. The sheet supply table 66 has a rack 70 attached to the lower surface thereof and held in selective mesh with a plurality of pinions 68 spaced horizontally from each other. When the pinions 68 are rotated, therefore, the sheet supply table 66 can be moved horizontally between the sensor supply unit 56 and the recorder 58. The sensor receiving unit 62 has a sheet delivery arm 72 for holding the stimulable phosphor sheet 52 in the recorder 58 and feeding the stimulable phosphor sheet 52 downwardly into the magazine 60. Between the tubular lens barrel 1 and the image recording device 50, there is disposed a shutter 74 angularly movable in the direction of the arrow B by levers (not shown). The focusing lens 32 and the image intensifier 33, identical to those shown in FIG. 1, are positioned above the shutter 74.

The interiors of the lens barrel 1 and the image recording device 50 are kept under vacuum by a known vacuum pump while the electron microscope is in operation. The spaces in the lens barrel 1 and the image recording device 50 are isolated from each other by a known shield (not shown) positioned between the lens barrel 1 and the image recording device 50. Therefore, the interior of the lens barrel 1 can be maintained under vacuum even when the interior of the image recording device 50 is in communication with the atmosphere at the time of loading the magazine 54 or taking out the magazine 60.

For recording electron microscope images, the sensor supply unit 56 is loaded with the magazine 54 containing a number of stimulable phosphor sheets 52 and the sensor receiving unit 62 is loaded with the magazine 60, which is empty. The shutter 74 is held in a horizontal position (as shown) to shield the recorder 58 from the electron beam 2. The pinions 68 are rotated clockwise to move the sheet supply table 66 to the right for supplying the lowermost stimulable phosphor sheet 52 from the magazine 54 to the recorder 58. While the stimulable phosphor sheet 52 is being fed along by the sheet supply table 66, the erasing light source 64 is energized to erase any remanent radiation energy from the sheet 52, which would otherwise induce a remaining image and noise. The sheet supply table 66 is stopped when the sheet 52 reaches the image-formation plane 9. The shutter 74 is then lifted out of the path of the electron beam 2, whereupon the electron beam 2 impinges on the stimulable phosphor sheet 52 to enable the same to emit instantaneous light. The emitted instantaneous light is multiplied by the image intensifier 33 to display a magnified scattered-light image 8b on the output surface 33b of the image intensifier 33. While observing the displayed image 8b, the operator operates the focusing control knob 30 to focus the image 8b and also determines a desired field of view and a desired magnification of the image 8b, as required.

After the focusing, field of view, and magnification of the magnified scattered-light image 8b have been determined by the operator, the shutter 74 is closed. The stimulable phosphor sheet 52 which was used for focusing the image 8b is then fed by the sheet delivery arm 72 into the magazine 60. By reversing the pinions 68, the sheet supply table 66 is moved back from the recorder 58 to the sensor supply unit 56 for supplying another stimulable phosphor sheet 52 to the recorder 58 in preparation for recording the magnified scattered-light image 8b as a final output image. Then, the shutter 74 is raised again to expose the stimulable phosphor sheet 52 to the electron beam 2 for recording the magnified scattered-light image 8b on the sheet 52. Since the focusing process has already been completed, the magnified scattered-light image 8b recorded on the stimulable phosphor sheet 52 is sharply focused.

The foregoing cycle is repeated to store images on the stimulable phosphor sheets 52 and also the stimulable phosphor sheets 52 used for focusing the images, in the magazine 60. Upon completion of the desired recording process, the magazine 60 is removed from the sensor receiving unit 62, and the stimulable phosphor sheets 52 contained in the magazine 60, other than those sheets used for focusing the images, are processed for reading the recorded images therefrom. To sort out the sheets 52 used for focusing the images and the sheets 52 recording thereon the magnified scattered-light images 8b to produce final output images, the data on how each of the sheets 52 in the magazine 54 is used should be recorded. The electron microscope images can be read from the sheets 52 by the same reader as shown in FIG. 1.

The recorded pattern or recorded information is determined by the recorded condition of a transmitted electron-beam image (magnified scattered-light image or magnified diffraction pattern) recorded on the stimulable phosphor sheet 10, 52, the nature of the specimen 8, and the manner of recording the image. For eliminating any adverse effect arising from variation in recording conditions or for obtaining an electron microscope image which can clearly be observed, such recorded information should be ascertained prior to the reproduction of a visible image by which the specimen can be observed. The read-out gain should be adjusted or the image-dependent signal should be processed on the basis of the ascertained recorded information. Furthermore, the generation of a reproduced image which can effectively be observed requires that a recording scale factor be determined in order to optimize the resolution of the reproduced image dependent on the contrast of the recorded pattern.

One way of ascertaining the recorded information on the sheet 10, 52 before a visible image is produced for observing the specimen 8 is disclosed in Japanese Unexamined Patent Publication No. 58(1983)-89245. More specifically, prior to the generation of a visible image for observing the specimen 8 (final reading mode), the recorded information stored in the stimulable phosphor sheet 10, 52 is read (preliminary reading mode) with stimulating light having a lower level of energy than that of stimulating light to be applied in the final reading mode. Based on the recorded information thus ascertained, the read-out gain is suitably adjusted or a recording scale factor is determined for the final reading mode, or the signal generated in the final reading mode is appropriately processed.

The photoelectric read-out means for photoelectrically reading light emitted from the stimulable phosphor sheet 10, 52 may employ a solid-state photoelectric transducer rather than the photomultiplier (see Japanese Patent Application Nos. 58(1983)-86226, 58(1983)-86227, 58(1983)-219313, and 58(1983)-219314, and Japanese Unexamined Patent Publication No. 58(1983)-121874). A plurality of solid-state photoelectric transducer elements may be disposed in covering relation to the entire surface of the stimulable phosphor sheet 10, 52, or may be located closely to the sheet 10, 52. The photoelectric read-out means may also employ a line sensor composed of an array of solid-state photoelectric transducer elements, or a single solid-state photoelectric transducer element corresponding to one pixel and movable to scan the entire surface of the sheet 10, 52.

The source of stimulating light may employ an array of light-emitting diodes or semiconductor lasers for preventing loss of light emitted from the sheet 10, 52 and for allowing the read-out means to detect emitted light at a larger angle for an increased S/N ratio. The electric signal generated by the read-out means can be read out at a high speed since the signal is rendered time-dependent by electric processing in the read-out means, not by time-dependent application of the stimulating light.

The stimulable phosphor sheet may be a thermofluorescent phosphor sheet. For discharging the stored energy from the thermofluorescent phosphor sheet, the sheet may be scanned by thermal radiation emitted from a heat source such as a $CO_2$ laser source. For more details, reference should be made to Japanese Patent Publication No. 55(1980)-47720.

After the image has been recorded on the stimulable phosphor sheet 10, 52, the vacuum chamber may be devacuumized, then the sheet 10, 52 may be taken out of the vacuum chamber, and finally the image stored therein may be read by an image reader separate from the electron microscope. However, where the stimulable phosphor sheet is recyclically used in the vacuum chamber as illustrated in FIG. 1, a number of images can successively be recorded and reproduced on the stimulable phosphor sheet without replacing the same or breaking the vacuum condition in the vacuum chamber.

With the arrangement of the present invention, an electron microscope image of a specimen is recorded with a high degree of sensitivity on a two-dimensional image sensor such as a stimulable phosphor sheet. Therefore, the amount of an electron beam emitted in the electron microscope can be lowered to reduce damage to the specimen which is caused by exposure to the electron beam. The recorded image is immediately displayed as on a CRT with high sensitivity. Where the reproduced image is utilized as a focus-adjusting monitor image, the monitor image is sharp and clear, making it possible to make focus adjustment which has heretofore been impossible with a low electron beam level.

Since the electron microscope image is read out as an electric signal, the image can be easily processed in various ways such as tone processing, frequency emphasis, etc. The processing of a diffraction pattern, the reconstruction of a three-dimensional image, and an image analysis such as image digitization can also be carried out simply and quickly by applying the electric signal to a computer.

The two-dimensional image sensor can be recycled after being exposed to erasing light or heat. Accordingly, an electron microscope image can be reproduced more economically by the arrangement of the invention than by the conventional silver-salt photographic system.

According to the method of the invention, furthermore, a focus-checking image is displayed by detecting and multiplying, with an image intensifier, instantaneous light emitted from the two-dimensional image sensor. The amount of an electron beam required to be radiated on the specimen for focusing the image is greatly reduced and the specimen is less liable to damage. In addition, the labor and time consumed for image focusing is also reduced to a large extent.

Although certain preferred embodiments have been shown and described, it should be understood that many changes and modifications may be made therein without departing from the scope of the appended claims.

We claim:

1. A method of recording and reproducing an image produced by an electron microscope, comprising the steps of:
   (i) exposing a two-dimensional image sensor under vacuum to an electron beam having passed through a specimen;
   (ii) detecting instantaneous light emitted from said two-dimensional image sensor upon exposure of the electron beam with an image intensifier to reproduce an image which can be observed by a user of the electron microscope;
   (iii) focusing the electron microscope to obtain a desired focused condition using the observed image;
   (iv) obtaining a desired field of view of the specimen using the observed image;
   (v) thereafter exposing said two-dimensional image sensor under vacum to an electron beam having been transmitted through the specimen to store the energy of the electron beam representative of the image of the specimen on said two-dimensional image sensor;
   (vi) applying stimulating energy to said two-dimensional image sensor for discharging light therefrom which represents the stored energy of the electron beam; and
   (vii) photoelectrically detecting the light discharged from said two-dimensional image sensor to reproduce the transmitted electron-beam image of the specimen as a final output image thereof under said desired focused condition and/or with said desired field.

2. A method according to claim 1, wherein the light discharged from said two-dimensional image sensor is detected while said two-dimensional image sensor is placed under vacuum.

3. A method according to claim 1, wherein said two-dimensional sensor comprises a stimulable phosphor sheet for discharging stimulated emission as said light respresenting the stored energy of the electron beam in response to exposure to said stimulating energy.

4. A method according to claim 1, wherein said stimulating energy is light.

5. A method according to claim 1, wherein said stimulating energy is heat.

6. The method according to claim 1, wherein said step of focusing comprises the step of adjusting the focal length of at least one lens in said electron microscope.

* * * * *